United States Patent [19]

Le et al.

[11] Patent Number: 5,432,119
[45] Date of Patent: Jul. 11, 1995

[54] HIGH YIELD ELECTRON-BEAM GATE FABRICATION METHOD FOR SUB-MICRON GATE FETS

[75] Inventors: Minh V. Le, Simi Valley; Loi D. Nguyen, Thousand Oaks, both of Calif.

[73] Assignee: Hughes Aircraft Company, Los Angeles, Calif.

[21] Appl. No.: 189,350

[22] Filed: Jan. 31, 1994

[51] Int. Cl.⁶ .............................................. H01L 21/00
[52] U.S. Cl. ..................................... 437/80; 437/912; 437/944; 437/947
[58] Field of Search ............... 437/80, 912, 944, 947

[56] References Cited

U.S. PATENT DOCUMENTS

| | | | |
|---|---|---|---|
| 4,429,452 | 2/1984 | Meignant | 437/80 |
| 5,171,718 | 12/1992 | Ishibashi et al. | 437/944 |
| 5,185,277 | 2/1993 | Tung et al. | 437/80 |
| 5,190,892 | 3/1993 | Sano | 437/944 |
| 5,336,626 | 8/1994 | Lee | 437/912 |

Primary Examiner—Brian E. Hearn
Assistant Examiner—Lynne A. Gurley
Attorney, Agent, or Firm—V. D. Duraiswamy; Wanda Denson-Low

[57] ABSTRACT

Yields of FETs such as HEMTs are significantly improved by establishing an elongate gate contact opening in a patterning material with the patterning material over-hanging the opening along both its elongate sides and its ends. A contact metal is next evaporated both into the opening and onto the adjacent patterning material, with the overhang producing a continuous gap around the periphery of the gate contact between it and the metal on the adjacent patterning material. The adjacent metal is then lifted-off without disturbing the gate contact. The inward tapered profile in the elongate direction of the contact opening is achieved with multiple parallel e-beam scans, while a similar profile is achieved at the ends of the elongate scans by increasing the electron beam dose in the vicinity of the scan ends, preferably by scanning the beam at a substantial angle to the elongate direction near the ends of the opening.

9 Claims, 4 Drawing Sheets

FIG. 1. (PRIOR ART)
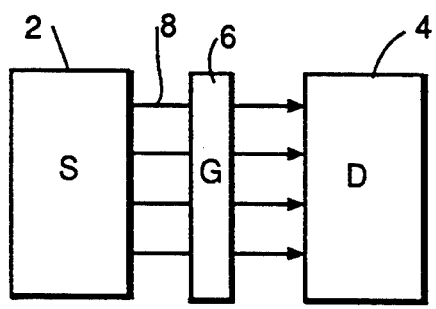
FIG. 2. (PRIOR ART)
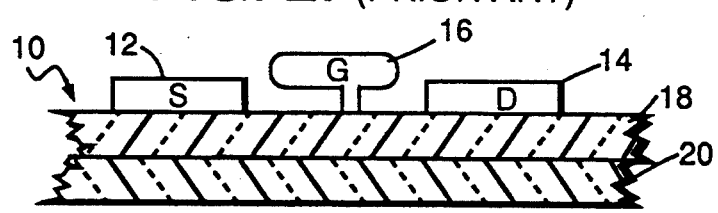
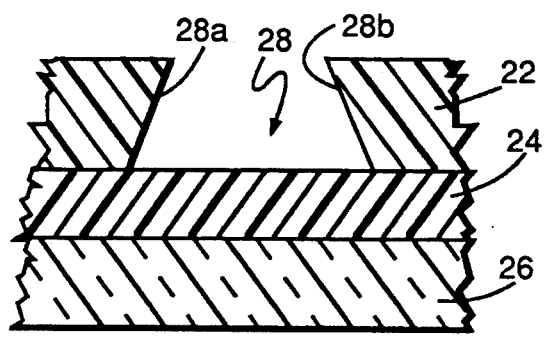
FIG. 3a. (PRIOR ART)

FIG. 9. (PRIOR ART)
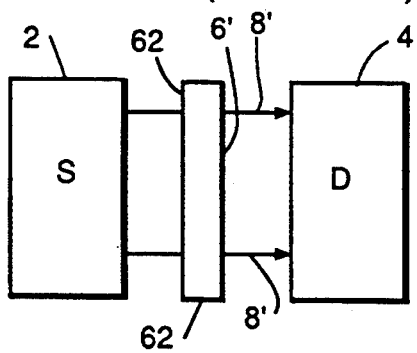
FIG. 10.
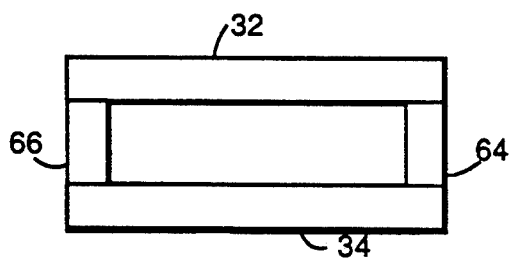
FIG. 11.
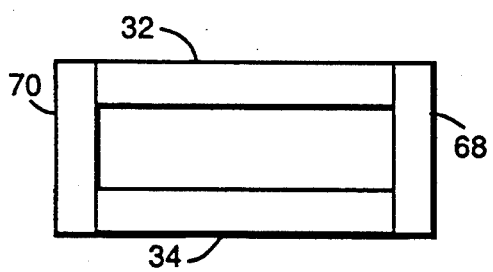
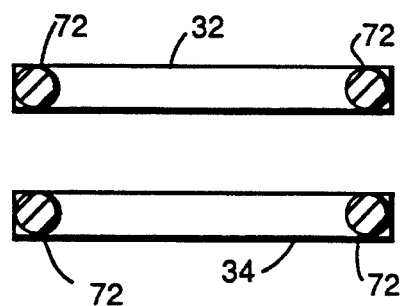
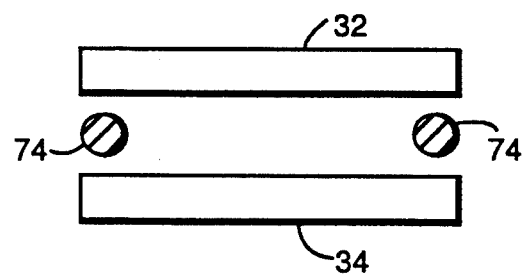
FIG. 12.
FIG. 13.
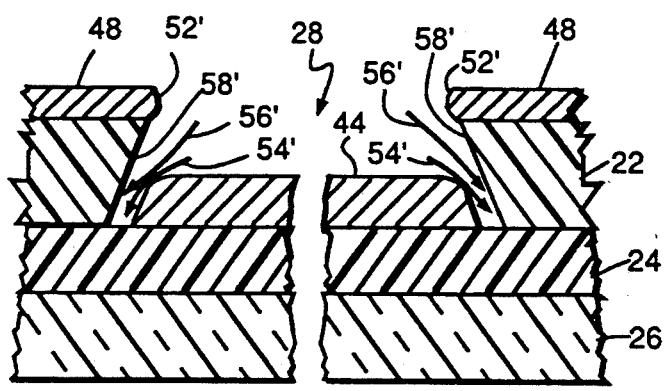
FIG. 14.

HIGH YIELD ELECTRON-BEAM GATE FABRICATION METHOD FOR SUB-MICRON GATE FETS

BACKGROUND OF THE INVENTION

1. Field of the Invention

This invention relates to fabrication methods for field effect transistor (FET) gates, and particularly to FETs with sub-micron gate lengths that are subject to a degradation in their yield when the unused gate metallization is lifted-off during fabrication.

1. Description of the Related Art

A functional diagram of a typical FET is given in FIG. 1. The device consists essentially of a source 2, a drain 4 and an intervening gate 6. With a voltage differential between the source and drain, the signal applied to the gate controls the flow of current 8. Below a particular negative gate voltage level, referred to as the pinch-off voltage, the flow of current is terminated.

FIG. 2 is a sectional view of a high electron mobility transistor (HEMT), which is a form of FET to which the present invention is particularly applicable. HEMTs are characterized by a very high transconductance, very high frequency operation and very low noise. They are fabricated from material systems such as AlGaAs/GaAs or AlInAs/GaInAs/InP.

The HEMT 10 is shown as including a source 12, drain 14 and an intervening gate electrode 16. A highly doped, wide bandgap semiconductor material 18 is inserted between an undoped semiconductor layer 20 which forms the conducting channel, and the gate electrode. When properly designed, a discontinuity in energy bandgaps between the two semiconductor materials results in a free charge transfer from the highly doped, wide-bandgap semiconductor 18 into the undoped, lower bandgap channel semiconductor 20. Charge accumulates at the interface of the two semiconductors and creates a two-dimensional electron gas (2 DEG), allowing current to flow between the source and drain electrodes. The amount of charge in the 2 DEG is controlled by the potential applied to the gate electrode. Since the charge flows at the interface between the two semiconductor materials, but is confined in the updoped channel semiconductor 20, there is very little impurity scattering and an extremely high charge carrier mobility results.

Sub-micron gate length HEMTs and other FETs are presently highly promising technologies for microwave and milimeter-wave applications. (The gate length is defined as the gate dimension in contact with the semiconductor substrate in the current flow direction between the source and drain.) However, as gate lengths have been reduced, there has been a corresponding increase in the proportion of devices that do not pinch-off. Yields have accordingly fallen, lowering production rates and increasing costs.

SUMMARY OF THE INVENTION

This invention seeks to provide a method of forming gate contacts for HEMTs and other FETs, particularly with sub-micron gate lengths, with a significant increase in the yield and performance, but without substantially increasing either the complexity or cost of the fabrication process.

The invention is based upon a hypothesis that the yield is degraded with the conventional electron-beam gate patterning process as a result of an impairment to the contact between the gate metallization and the underlying semiconductor substrate during surplus metallization lift-off. Working from the assumption that the excess metallization maintains a connection with the ends of the gate contact and lifts the ends off that contact up as the excess metallization is removed, thus producing an incomplete gate, the invention provides a new gate fabrication technique in which the gate contact is spaced away from the surplus metallization around its entire periphery prior to lift-off. In this way the upward pull on the ends of the gate is eliminated, and a close connection is maintained with the substrate along the full length of the gate contact.

In a preferred embodiment, two layers of photoresist are provided over the substrate. The upper photoresist layer is scanned in a conventional manner with an e-beam in multiple parallel elongate scans to establish a first opening in the upper layer, the opening having elongate side walls that are tapered inward towards the top of the opening. To prevent an uplift at the ends of the contact, the e-beam dose is increased in the vicinity of the ends of the elongate scans, thus providing the opening with an inward taper towards its top in the elongate direction as well as the transverse direction. The increased dose can be achieved in various ways, such as scanning the e-beam in a direction transverse to the elongate scans at the ends of the opening, increasing the beam dwell time at the ends of the elongate scans, or momentarily holding the beam at an intermediate position between the ends of the elongate scans.

Once the opening in the upper photoresist layer has been established, an actual contact path to the semiconductor substrate is formed by scanning a narrower opening through the lower photoresist layer. Even when this narrower opening is sub-micron, the invention has been found to prevent the ends of the contact from dislodging, and thereby significantly improve the yield.

The gate contact material is preferably a metal that is evaporated into the contact opening as well as onto the adjacent photoresist. The evaporated metal forms saddle profiles on the photoresist along both the sides and ends of the contact opening. The saddle profiles progressively shade the opening, thus progressively reducing both the length of the contact in the elongate direction and its transverse width as the evaporation proceeds. A continuous gap is thereby formed between the gate contact and the evaporated metal on the adjacent photoresist. The photoresist and its overlying metal is removed, without disrupting the gate contact, by flowing a solvent into the gap.

Further features and advantages of the invention will be apparent to those skilled in the art from the following detailed description, taken together with the accompanying drawings.

BRIEF DESCRIPTION OF THE DRAWINGS

FIG. 1 is a simplified plan view, described above, illustrating the functional components of an FET;

FIG. 2 is a sectional view of a HEMT, described above;

FIGS. 3a and 3b are respectively a transverse sectional view of a conventional gate contact opening, and a diagram of multiple e-beam scans used to produce the opening;

FIG. 5 is a fragmentary transverse sectional view showing a more typical shape for the outer gate contact opening illustrated in FIG. 3a;

FIG. 6 is a transverse sectional view illustrating the conventional method for forming an FET gate contact within the patterned opening shown in FIG. 4a;

FIG. 9 is a simplified plan view illustrating the current flow mechanism hypothesized by the invention which degrades the yield for a conventional sub-micron gate;

FIGS. 10–13 are plan views illustrating various modifications in the e-beam scanning that can be used by the invention to improve the FET yield; and FIG. 14 is an elongate sectional view of an FET gate contact fabricated with the invention prior to photoresist and surplus metallization lift-off.

DETAILED DESCRIPTION OF THE INVENTION

FIG. 3a illustrates an early stage in a conventional FET gate contact fabrication process, for either a HEMT or other type of FET. Upper and lower layers 22 and 24 of a photolithographic patterning material, typically a photoresist, are formed on a semiconductor substrate 26. An opening 28 is made in the upper photoresist layer with an e-beam, such that the opening's side walls 28a and 28b are spaced further apart from each other at the bottom of the opening than at the top. As described below, the gate contact is formed within the opening 28.

Figure 3B:
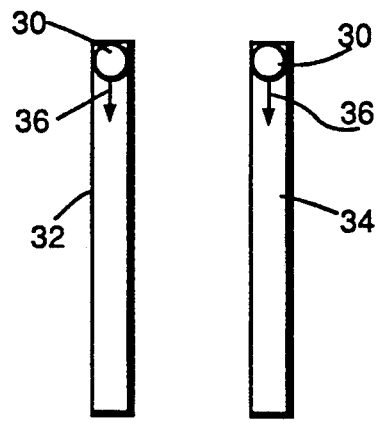

The technique used to establish the opening 28 is illustrated in FIG. 3b. An e-beam, indicated by an e-beam spot 30, is scanned across the photoresist in multiple (typically two) parallel scans, the paths of which are indicated by rectangular tracks 32 and 34. The two e-beam scans are close enough together to establish an energy sharing between them, which results in the inward tapered profile for the contact opening 28 illustrated in FIG. 3a. The e-beam 30 is typically about 100 nm in diameter. With a separation between the centers of the beam scans 32 and 34 of about 0.25–0.35 microns, a recess opening with a width of about 0.8–0.9 microns typically results. The lengths of the beam scans in the elongate direction indicated by arrows 36 are generally about 25–150 microns. The e-beam dose is typically about 120–170 microcoulombs/cm².

Figure 4A:
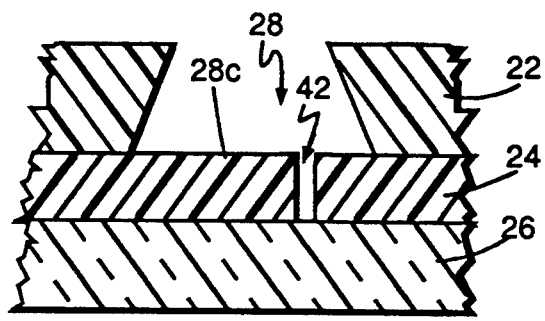
FIGS. 4a and 4b are respectively a transverse sectional view of a conventional gate contact pattern with an inner sub-micron contact opening, and a diagram of an e-beam scan used to produce the narrow inner opening.
Figure 4B:

The next step in the gate contact fabrication is illustrated in FIGS. 4a and 4b. This involves scanning the floor 28c of the upper opening 28 with an e-beam 38 of reduced spot size, generally about 40–50 nm, along an elongate track 40 that is generally offset from the center of the opening 28. This forms an inner and narrower opening 42 through the lower photoresist layer 24 down to the upper surface of the semiconductor substrate 26.

Figure 5:
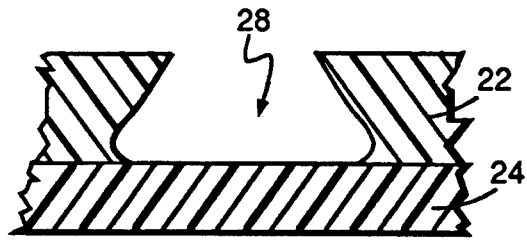

The profile of the gate contact opening 28 in FIGS. 3a and 4a is shown with straight side walls, for purposes of simplification. In practice, these walls will generally be curved as illustrated in FIG. 5. However, the opening's width across its top is still less than its width towards the bottom.

In the next step of the fabrication, still following the conventional method, the photoresist is developed and a metallic gate contact material is evaporated onto the device. This forms a gate contact 44 within the outer opening 28, including a contact extension 46 through the inner opening 42 that establishes the actual contact with the semiconductor substrate.

The metal evaporation also builds up a metallic layer 48 on the upper surface of the photoresist layer 22 adjacent the gate contact opening. As the evaporation progresses, the metal layer 48 overhangs the opening 28, inward of the upper opening edges 50, to form a "saddle" profile 52. The distance between the opposite sides of the "saddle" profile becomes progressively less as the metallization build up continues, so that the upper metal layer 48 extends over and shades an increasing portion of the opening 28 along both sides of the opening. As a result, the width of the gate contact metallization 44 is progressively reduced as the evaporation proceeds, and the upper metallization layer 48 is spaced from the gate metallization 44 by a gap 54 along both sides of the gate.

Once the gate contact has been completed, a solvent (indicated by arrows 56) is flowed into the gap 54, where it attacks the photoresist layers 22 and 24, dissolving them and lifting off the overlying metallization layer 48. This completes the gate contact, leaving it as a free-standing member such as contact 16 in FIG. 2.

The length of the gate extension 46 that actually contacts the semiconductor substrate (with the "length" taken in the horizontal direction in FIG. 6) in the past has exceeded 1 micron, but more recently sub-micron gate lengths have been employed, typically about 0.1–0.25 microns. This reduction in gate dimension has been accompanied by a serious deterioration in the yield. The present invention has postulated a cause for this problem, and modifies the gate fabrication technique in a way that overcomes the postulated cause. While a direct verification of the postulated cause for the reduction in yield has not been obtained, the solution proposed by the inventors has been found to result in a very significant improvement in yield.

Figure 6:
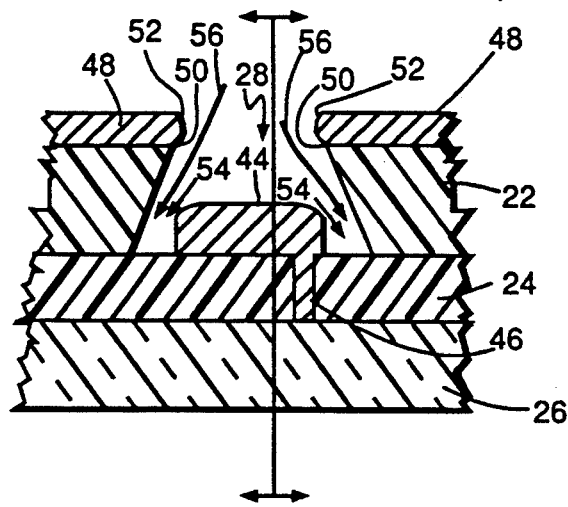
Figure 7:
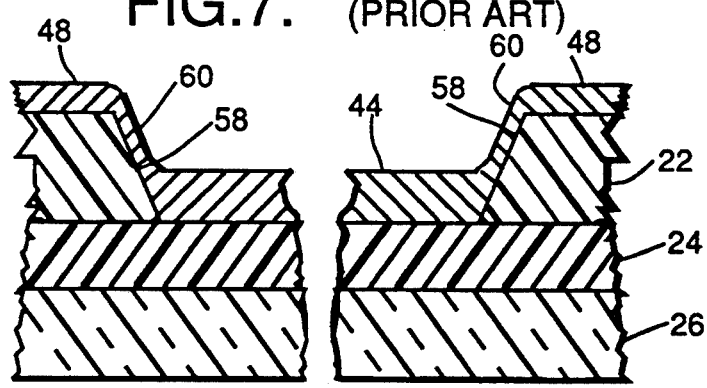
FIG. 7 is an elongate sectional view, taken along the section line 7—7 of FIG. 6, illustrating the metallization pattern at the elongate ends of the gate contact prior to photoresist lift-off with a conventional fabrication technique, as hypothesized by the invention.

Whereas a semiconductor die can be cleaved transverse to the gate contact to produce a transverse view such as that illustrated in FIG. 6, the relatively narrow gate lengths have made it impractical to cleave the gate along the longer gate dimension, 90° to the view shown in FIG. 6. However, a view taken along the elongate direction of the gate, 90° to FIG. 6, is hypothecated in FIG. 7 to illustrate the problem which the inventors have postulated. It will be recalled that the photoresist opening 28 has a wider dimension at its bottom than at its top transverse to the elongate direction, as illustrated in FIG. 3a, because of the energy sharing between the multiple e-beam scans illustrated in FIG. 3b. However, no such energy sharing exists at the ends of the scans in the elongate direction. Accordingly, the inventors have postulated that the end wall 58 of the photoresist opening 28 at the elongate ends of the opening flare outwards towards the top of the opening, as illustrated in FIG. 7. Since the side walls 58 would not shade the interior of the opening from the metal evaporation, it has been further postulated that the metallization 48 on top of the photoresist layer 22 continues in an unbroken metal connector layer 60 over the opposite ends of the contact opening, and merge into the contact metallization 44. As a consequence, lifting-off the upper metallization 48 with the photoresist solvent tends to lift up the opposite ends of the gate contact 44, until the metal connector layers 60 are broken.

Figure 8:
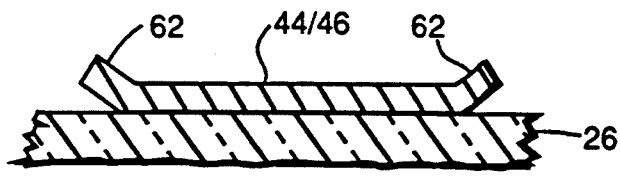
FIG. 8 is a fragmentary sectional view of a completed conventional gate contact as hypothesized by the invention.

The results of such a process are illustrated in FIG. 8, in which the opposite elongate ends 62 of the gate contact 44/46 are shown raised up and out of direct contact with the substrate 26. As a consequence, the device does not pinch-off. This is illustrated in FIG. 9, in which it is assumed that the designed pinch-off voltage is applied to the gate contact 6', whose opposite ends 62 are bent up from the substrate surface. The current flow between the source 2 and drain 4 is pinched-off below the main body of the gate contact 6', but a current 8' continues to flow through the channel below the lifted end portions 62.

While as stated above it has not been practical to cleave the narrow gate contact in the elongate direction to obtain a view like FIG. 8, there is circumstantial evidence for the cause of the drop in yield that has been postulated here. A degree of roughness or tearing has been observed at the ends of the gate contact, which is consistent with the contact ends being lifted up by the upper metallization 48 until the connector layer 60 are torn. This theory is also consistent with the fact that the yield drops as the gate length is reduced. Since a reduced gate length involves a reduction in the dimension of the lower gate extension 46, but not of the upper gate portion 44, a smaller gate length means that there is less of an area contact between the gate extension 46 and the underlying semiconductor substrate 26 to hold the ends of the gate in contact with the substrate, while the area of the connector layer 60 through which the uplifting force on the gate is exerted remains the same.

Having postulated the cause of the drop in DC yield, the invention proposes to overcome the problem by modifying the fabrication method so as to eliminate the connector layer 60. This is accomplished by adjusting the e-beam scanning so that the opening 28 is tapered to a smaller dimension towards its top in the elongate direction of FIG. 7, as well as in the transverse direction of FIG. 6.

The desired modification in the profile of the upper photoresist opening 28 is achieved by increasing the e-beam dose in the vicinity of the ends of the elongate scans 32 and 34. This has an effect similar to the use of multiple parallel scans in the elongate direction, and produces tapered end walls for the openings that are further apart at the bottom than at the top.

One way to achieve the desired increase in e-beam dose towards the ends of the elongate scans is to perform a transverse e-beam scan at each end. This can be done with transverse e-beam scans 64 and 66 between the opposite ends of the elongate scans 32 and 34 as illustrated in FIG. 10, or with transverse scans 68 and 70 just beyond the ends of the elongate scans 32 and 34 as illustrated in FIG. 11. The transverse scans would generally be performed with the same e-beam spot size and dose as the elongate scans. Presently available e-beam equipment can easily handle a change in the scanning direction of this type. Although the end scans are illustrated as being 90° to the elongate scans, other end scan orientations could be employed so long as they are performed at a substantial angle to the elongate direction. Also, the end scans could be performed before the elongate scans if desired.

Another approach to obtaining the desired end profile is illustrated in FIG. 12. Rather than scanning the e-beam between the ends of the two elongate scans, the e-beam is momentarily held stationary at the end of each elongate scan, as indicated by the high dose beam spots 72. The duration of the beam dwell time at each end would have to be controlled to avoid an overdose, which would result in a wider gate and corresponding higher parasitic capacitance and noise values. The particular dwell time for any given application will depend upon the specific elongate scan dimensions and dose rates used. Although conventional e-beam systems used for FET fabrication do not presently have a capability of holding the beam stationary at the end of a scan, future systems may have such a capability.

A similar scanning technique is illustrated in FIG. 13. However, rather than holding the e-beam stationary at the end of each elongate scan, the beam is controlled so that it dwells at an intermediate location 74 between the ends of the elongate scans for a period of time sufficient to establish the desired tapered end profile. Again, the dwell time would need to be limited to prevent an undesired increase in gate length at the opposite ends of the elongate scans. As with the technique illustrated in FIG. 12, practical implementation of the scanning modification shown in FIG. 13 would need to await the development of e-beam equipment with this capability.

FIG. 14 is a sectional view showing what is believed to be the gate contact profile in the elongate direction that results from any of the e-beam scanning modifications illustrated in FIGS. 10–13. The end walls 58' of the contact opening 28 now slant inwards towards their upper ends in a manner similar to the elongate opening wall 28a, 28b of FIG. 3a, and saddle profiles 52' are accordingly developed by the evaporated metallization 48 over the upper end edges of the opening. This results in an inward tapered end profile for the gate contact 76, similar to the tapered elongate profile illustrated in FIG. 6. (The taper would actually be expected to be curved in a fashion similar to FIG. 5). The upper metallization 48 is accordingly spaced from the gate contact 76 at the ends of the contact opening as well as along its elongate sides, leaving gaps 54' between the ends of the gate contact and the adjacent photoresist into which the solvent 56' can flow. A continuous gap is thus established around the full periphery of the gate contact between it and the metal layer 48 on the adjacent photoresist. This eliminates the metal connector layers 60 postulated for the prior fabrication technique, and allows the photoresist metallization layer 48 to be lifted-off without disturbing the gate contact.

The effectiveness of the invention in improving yields was demonstrated with a HEMT that had a 0.1 micron gate length and an InP substrate. With the conventional lithographic patterning of the gate contact opening described above, yields in the range of 55–72% were achieved. When the e-beam scanning was modified as illustrated in FIG. 10 to increase the beam dose at the ends of the elongate scans, the yields improved to a range of 80–92%. The ends of the gate contact were found to be smooth rather than torn, supporting both the explanation of the prior poor yield and the action of the invention's solution described above.

While several illustrative particular embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of forming an elongate electrically conductive contact on a semiconductor substrate, comprising:

depositing a patterning material on said substrate, forming an elongate first opening in said patterning material with elongate sides and opposite ends such that the patterning material adjacent the opening overhangs the opening along both its elongate sides and ends, forming electrical contact bodies within said first opening and overlying the patterning material adjacent said opening, with the contact body within the first opening spaced around its full periphery from the contact body overlying the patterning material, and removing the patterning material and overlying contact body adjacent said first opening, wherein said first opening is formed by making multiple spaced and parallel scans of said substrate in the elongate direction with an electron beam, and increasing the electron beam dose in the vicinity of the ends of said elongate scans.

2. The method of claim 1, wherein the electron beam dose is increased in the vicinity of the ends of said elongate scans by scanning the beam in the vicinity of the ends of the elongate scans at a substantial angle to said elongate direction.

3. The method of claim 1, wherein the electrical contact body within said first opening comprises the gate contact of a field effect transistor.

4. A field effect transistor (FET) fabrication method, comprising:

forming a source, drain, source contact and drain contact on a semiconductor substrate, establishing a photoresist layer on said substrate between the locations of said source and drain contacts, performing multiple spaced and generally parallel elongate scans of an electron beam along said photoresist layer to form a first elongate opening in the photoresist whose width transverse to the elongate direction increases between the top of said opening and its bottom, increasing the electron beam dose in the vicinity of the ends of said elongate scans to make the width of said first opening increase in the elongate direction between the top of said opening and its bottom, depositing an electrical contact material into said opening and onto said photoresist adjacent said opening so that the elongate sides and the ends of the contact material inside the opening are spaced from the contact material on the photoresist adjacent said opening, and lifting off the photoresist and the overlying contact material adjacent said opening, leaving the contact material that was in the opening as a gate contact.

5. The method of claim 4, wherein the electron beam is increased in the vicinity of the ends of said elongate scans by scanning an electron beam along said photoresist layer in the vicinity of the ends of said elongate scans at a substantial angle to the elongate direction.

6. The method of claim 4, wherein said electrical contact material is a metal that is deposited by evaporation, said evaporated metal forming saddle profiles on the photoresist along the elongate and end edges of said first opening, said saddle profiles progressively extending over the edges of said opening as the evaporation proceeds to progressively reduce both the length of said gate contact in the elongate direction, and its width transverse to the elongate direction.

7. The method of claim 6, wherein said saddle profiles progressively shade the gate contact as the evaporation proceeds, thereby leaving a continuous gap around the gate contacts periphery between the gate contact and the metal on the adjacent photoresist, and said photoresist is lifted off by flowing a solvent into said gap.

8. The method of claim 4, wherein said first elongate opening is formed with a floor in an upper portion of the photoresist, further comprising the step of forming a narrower elongate opening through a lower portion of the photoresist from the floor of the first opening to said substrate, with said electrical contact material extending through said narrower opening to contact said substrate.

9. The method of claim 8, wherein said narrower opening is less than one micron wide.

* * * * *